United States Patent
Angyal et al.

(10) Patent No.: US 8,188,574 B2
(45) Date of Patent: May 29, 2012

(54) PEDESTAL GUARD RING HAVING CONTINUOUS M1 METAL BARRIER CONNECTED TO CRACK STOP

(75) Inventors: Matthew S. Angyal, Hopewell Junction, NY (US); Mahender Kumar, Hopewell Junction, NY (US); Effendi Leobandung, Hopewell Junction, NY (US); Jay W. Strane, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 12/704,567

(22) Filed: Feb. 12, 2010

(65) Prior Publication Data

US 2010/0200958 A1 Aug. 12, 2010

Related U.S. Application Data

(60) Provisional application No. 61/151,976, filed on Feb. 12, 2009.

(51) Int. Cl.
*H01L 29/72* (2006.01)

(52) U.S. Cl. ........ 257/619; 257/347; 257/401; 257/488; 257/629; 257/659; 257/692; 257/773; 438/121; 438/125; 438/424

(58) Field of Classification Search .................. 257/347, 257/401, 488, 619, 629, 659, 692, 773; 438/121, 438/125, 424
See application file for complete search history.

(56) References Cited

U.S. PATENT DOCUMENTS

| | | | |
|---|---|---|---|
| 7,358,172 | B2 | 4/2008 | Dobuzinsky et al. |
| 2003/0157794 | A1 | 8/2003 | Agarwala et al. |
| 2004/0061183 | A1 | 4/2004 | Johnson et al. |
| 2004/0129938 | A1 | 7/2004 | Landers et al. |
| 2005/0026397 | A1 | 2/2005 | Daubenspeck et al. |
| 2006/0014376 | A1 | 1/2006 | Agarwala et al. |
| 2006/0190846 | A1 | 8/2006 | Hichri et al. |
| 2006/0220250 | A1 | 10/2006 | Kim et al. |
| 2007/0013072 | A1 | 1/2007 | Ellis-Monaghan et al. |
| 2007/0164421 | A1 | 7/2007 | Ahsan et al. |
| 2007/0262305 | A1 | 11/2007 | Adkisson et al. |
| 2008/0099884 | A1 | 5/2008 | Inohara |
| 2010/0013043 | A1 * | 1/2010 | Liu et al. ............... 257/491 |

* cited by examiner

*Primary Examiner* — Edward Wojciechowicz
(74) *Attorney, Agent, or Firm* — Wenjie Li; Daryl Neff

(57) ABSTRACT

A microelectronic element, e.g., a semiconductor chip having a silicon-on-insulator layer ("SOI layer") separated from a bulk monocrystalline silicon layer by a buried oxide (BOX) layer in which a crack stop extends in first lateral directions at least generally parallel to the edges of the chip to define a ring-like barrier separating an active portion of the chip inside the barrier with a peripheral portion of the chip. The crack stop can include a first crack stop ring contacting a silicon portion of the chip above the BOX layer; the first crack stop ring may extend continuously in the first lateral directions to surround the active portion of the chip. A guard ring ("GR") including a GR contact ring can extend downwardly through the SOI layer and the BOX layer to conductively contact the bulk monocrystalline silicon region, the GR contact ring extending at least generally parallel to the first crack stop ring to surround the active portion of the chip. A continuous metal ring extending continuously in the first lateral directions can surround the active portion of the chip, such metal ring connecting the GR contact ring with the first crack stop ring such that the metal line and the GR contact ring form a continuous seal preventing mobile ions from moving between the peripheral and active portions of the chip.

22 Claims, 7 Drawing Sheets

PEDESTAL GUARD RING HAVING CONTINUOUS M1 METAL BARRIER CONNECTED TO CRACK STOP

This non-provisional application claims the benefit of the provisional application filed with the U.S. Patent and Trademark Office as Ser. No. 61/151,976 entitled "Pedestal Guard Ring Having Continuous M1 Metal Barrier Connected To Crack Stop", filed Feb. 12, 2009.

BACKGROUND OF THE INVENTION

1. Field of the Invention

The embodiments described in the present application relate to microelectronic elements such as, for example, semiconductor chips and their manufacture. More particularly, the embodiments described herein relate to silicon-on-insulator semiconductor chips which have a guard ring for providing electrical continuity and a crack stop adjacent to the guard ring.

2. Description of Related Art

A common problem in the fabrication of microelectronic elements such as semiconductor chips is to protect the chip from cracking Semiconductor wafers are flat, thin, i.e., less than one millimeter (0.04 inch) thick, large, typically being up to 300 mm (about 12 inches) in diameter, and relatively brittle. At a final stage of fabrication, the semiconductor wafer is severed into individual semiconductor chips, either by sawing or by scribing and breaking. When severed by sawing or by scribing and breaking, the semiconductor wafer is subjected to high shear stresses which can cause cracks to form which extend inwardly from the sawn or scribed and broken edges of each chip. During use, semiconductor chips are subjected to additional stresses from heating and differential thermal expansion of the chip relative to components of packages and circuit panels to which they are attached. Due to the stresses encountered when severing the chip or even later during use, cracks can propagate inward from the edges of a chip and eventually reach an active portion of the chip, damaging semiconductor devices disposed in the active portion. To address this problem, the chip can have a crack stop in form of a metallic ring-like structure extending continuously adjacent to and parallel to the edges of the chip so as to encompass the active portion of the chip. Cracks that extend inwardly from edges of a chip are halted by the crack stop from propagating into active device areas of the chip.

The ring-like crack stop of a chip typically extends vertically upward from a monocrystalline semiconductor device layer of the chip through all of the back-end-of-line ("BEOL") metallization layers of the chip. In some types of semiconductor chips, a crack stop has a second function to provide a conductive path to a continuous semiconductor region of the chip which serves as a common electrical ground. Typically, the continuous semiconductor region is a semiconductor region underlying the device layer of the chip which has the same predominant dopant type (either n type or p type) throughout.

One problem arises during fabrication of semiconductor chips on silicon-on-insulator ("SOI") type wafers. SOI wafers have a structure in which a monocrystalline semiconductor device layer (usually silicon) is separated from a bulk monocrystalline semiconductor layer (also usually silicon) by a buried dielectric layer. The buried dielectric layer typically is a buried oxide ("BOX") layer consisting essentially of silicon dioxide. In some SOI wafers, the crack stop may extend only into the monocrystalline device layer of the chip and may not connect to the bulk semiconductor region of the chip at all. This can be in order to address a manufacturing problem. A crack stop that extends continuously to the bulk semiconductor region of an SOI chip, thus grounding the crack stop, can lead to arcing during the performance of certain BEOL processing such as plasma processing and RIE. To address this problem, in some chips the crack stop extends only to the semiconductor device layer of the chip so that the crack stop is not directly connected to ground.

However, each chip needs a continuous path to ground in order to discharge high electrostatic voltages that can arise on exposed surfaces of the wafer during certain wafer fabrication processes. For example, high electrostatic voltages can arise during certain types of BEOL processing applied to a wafer to form the metal wiring lines of the chip, such as for example, during plasma and reactive ion etch ("RIE") processes. A discharge path to ground is also needed during operation of the chip after the chip is fully completed.

Since the chip requires a conductive discharge path to ground, a ground ring can be provided separately from the crack stop for conductive connection with the bulk semiconductor region of the chip. Unlike the crack stop, the ground ring can include a contact ring which extends through the BOX layer to physically and conductively contact the bulk semiconductor region and provide a ground connection.

Thus, an SOI chip can have a crack stop formed as a series of vertically stacked continuous metal rings adjacent to the chip edges to prevent cracks from propagating from the chip edges inward towards the active portion of the chip. Such SOI chip can also have a guard ring disposed inward from the crack stop such that the guard ring and the crack stop are disposed between the active portion of the chip and the chip edges. The crack stop can be mechanically continuous in the vertical direction for stopping cracks. The guard ring extends between overlying conductive features of the chip and the bulk semiconductor region of the substrate but need not be mechanically continuous like the crack stop.

FIG. 1 is a plan view illustrating a chip 10 according to the prior art. In the various figures and views herein, features are not drawn to scale. Rather, features in each drawing are shown in a manner to enhance understanding and for ease of illustration. The chip can be a fully formed chip such as may be packaged individually and operated with a source of power applied thereto. As seen in FIG. 1, the chip includes a crack stop 11 extending in directions parallel to and adjacent to edges 20 of the chip. A guard ring 14 disposed inward from the crack stop 11 extends in directions parallel to and adjacent to the chip edges 20. An active portion 16 of the chip is disposed inward from the guard ring 14. The guard ring 14 and the crack stop 11 separate the active portion 16 of the chip in a lateral direction 15 from a peripheral portion 18 of the chip adjacent to the chip edges 20.

As seen in FIG. 1, the guard ring includes a conductive contact ring 12 which extends continuously around the active portion 16 to form a barrier laterally separating the active portion 16 from portions of the chip disposed laterally outward (i.e., closer to edges 20) from the contact ring 12. The contact ring 12 can be formed of doped polysilicon, a metal or a conductive compound of a metal. Referring to the corresponding sectional view of FIG. 2, the contact ring 12 extends vertically downward through a contact level interlevel dielectric ("ILD") layer 21. The contact ring 12 is conductively connected to a highly doped semiconductor ring region 22 that extends downward from a major surface 24 to the bulk semiconductor region 28 of the SOI chip. The semiconductor ring region can consist essentially of monocrystalline or polycrystalline semiconductor material.

In turn, the semiconductor ring region 22 extends through the BOX layer 26 of the chip to form a conductive connection to a bulk monocrystalline semiconductor region 28 of the chip referenced as "Substrate" in FIG. 2. As seen in FIG. 2, a dielectric ILD layer 30 for a first metallization level (M1) overlies an upper surface 32 of the contact ring 12.

As further illustrated in FIG. 1, conductive pedestals 34 overlie portions of the contact ring 12 and extend vertically upward through successively higher metallization levels of the chip 10. The conductive pedestals are separated by gaps 36 in directions that the conductive contact ring 12 extends. The gaps 36 provide electrical discontinuities between conductive pedestals, preventing electrical currents from traveling laterally across the gaps between the pedestals 34.

The guard ring further includes a metallic ring 38, shown as the hatched rectangular ring area overlying all of the conductive pedestals 34 and the contact ring 12 and in conductive communication therewith. Typically provided in an uppermost (last) metallization level of the chip, the metallic ring 38 extends continuously to surround the active portion 14 of the chip. The metallic ring 38, conductive pedestals 34 and conductive contact ring 12 form conductive paths for the flow of discharge currents in a downward direction 17 (FIG. 2) to the bulk semiconductor region 28 (FIG. 2) of the chip.

The crack stop 11 includes a plurality of continuous metal rings surrounding the guard ring 14 and the active portion 16 of the chip, of which one metal ring 44 is shown in FIG. 1. Some of the metal rings of the crack stop are continuous metal lines, e.g., ring 44, in the vertically stacked wiring layers of the chip, such as M1, M2, etc. Other metal rings are provided as continuous regions of metal that connect vertically adjacent ones of the continuous metal lines.

FIG. 2 is a sectional view of the chip 10 through line 2-2' of FIG. 1. As best seen in FIG. 2, one metal ring 44 of the crack stop 11, provided in the first metallization (M1) layer of the chip, overlies and is disposed in conductive communication with a vertically extending contact ring 46 of the crack stop. In turn, the contact ring 46 is disposed in contact with a semiconductor portion 48 of the chip 10. The semiconductor portion 48 typically consists essentially of doped monocrystalline silicon. The sectional view through line 2-2' of FIG. 1 extends through the gap 36 between adjacent conductive pedestals 34. Therefore, the conductive pedestal does not appear in FIG. 2 and only a contact ring 12 of the ground ring, or "GR contact ring" appears which connects to an underlying GR semiconductor ring region 22. The GR ring region 22 extends through the BOX layer 26 of the SOI chip to contact the bulk semiconductor region 28 indicated as "Substrate" in FIG. 2.

An oxide isolation region 52, typically provided as a shallow trench isolation region, laterally separates the substrate ring region 22 of the guard ring from the silicon region 48 of the crack stop. In a vertical direction 17, the oxide region 52 extends upward from the BOX layer 26 to a top surface 24. The BOX layer 26 and the oxide region 52 together may form a continuous region of oxide extending upward from the bulk semiconductor region 28.

A layer 50 of silicon nitride typically overlies the top surface 24 of the dielectric region 52. The silicon nitride layer 50 typically has little to no internal stress. In chip 10, the low or zero-stress silicon nitride layer 50 functions as a barrier which inhibits or prevents the mobile ions from traveling through the layer 50. As a result, mobile ions can travel from a peripheral edge 20 of the chip through the BOX layer 26 of silicon oxide only as far as the silicon nitride layer 50. The low-stress silicon nitride layer 50 of the prior art prevents mobile ions from traveling along path 60 past the crack stop contact ring 46 and into oxide regions of the chip such as the lower ILD region 21 and the M1 ILD region 30, from where they could travel unhindered into the active device areas (not shown) of the chip.

Thus, in prior art chip 10, the silicon nitride layer 50, together with the metallic and semiconductor regions 44, 46, 48 of the crack stop form an effective barrier to prevent mobile ions from traveling in a direction from peripheral edges 20 of the chip towards an active portion 16 (FIG. 1) of the chip.

SUMMARY OF THE INVENTION

According to an aspect of the invention, a microelectronic element is provided which includes a semiconductor chip including a monocrystalline silicon-on-insulator layer ("SOI layer"), a bulk monocrystalline silicon layer and a buried oxide (BOX) layer separating the SOI layer from the bulk silicon layer, the SOI layer having a plurality of microelectronic semiconductor devices therein, and the chip having a plurality of peripheral edges extending in a direction away from the SOI layer downwardly through the BOX layer and the bulk silicon layer. A crack stop can extend in first lateral directions at least generally parallel to the edges of the chip to define a ring-like barrier separating an active portion of the chip inside the barrier with a peripheral portion of the chip outside the barrier. The crack stop can include a first crack stop ring contacting a silicon portion of the chip above the BOX layer; the first crack stop ring may extend continuously in the first lateral directions to surround the active portion of the chip. A guard ring ("GR") including a GR contact ring can extend downwardly through the SOI layer and the BOX layer to conductively contact the bulk monocrystalline silicon region. The GR contact ring may extend linearly at least generally parallel to the first crack stop ring to surround the active portion of the chip. The GR may further include a continuous metal ring extending continuously in the first lateral directions to surround the active portion of the chip, such metal ring connecting the GR contact ring with the first crack stop ring such that the metal line and the GR contact ring form a continuous seal that prevents mobile ions from moving between the peripheral and active portions of the chip.

In accordance with another aspect of the invention, a method is provided for fabricating a microelectronic element having a crack stop and a guard ring

DETAILED DESCRIPTION

Figure 1:
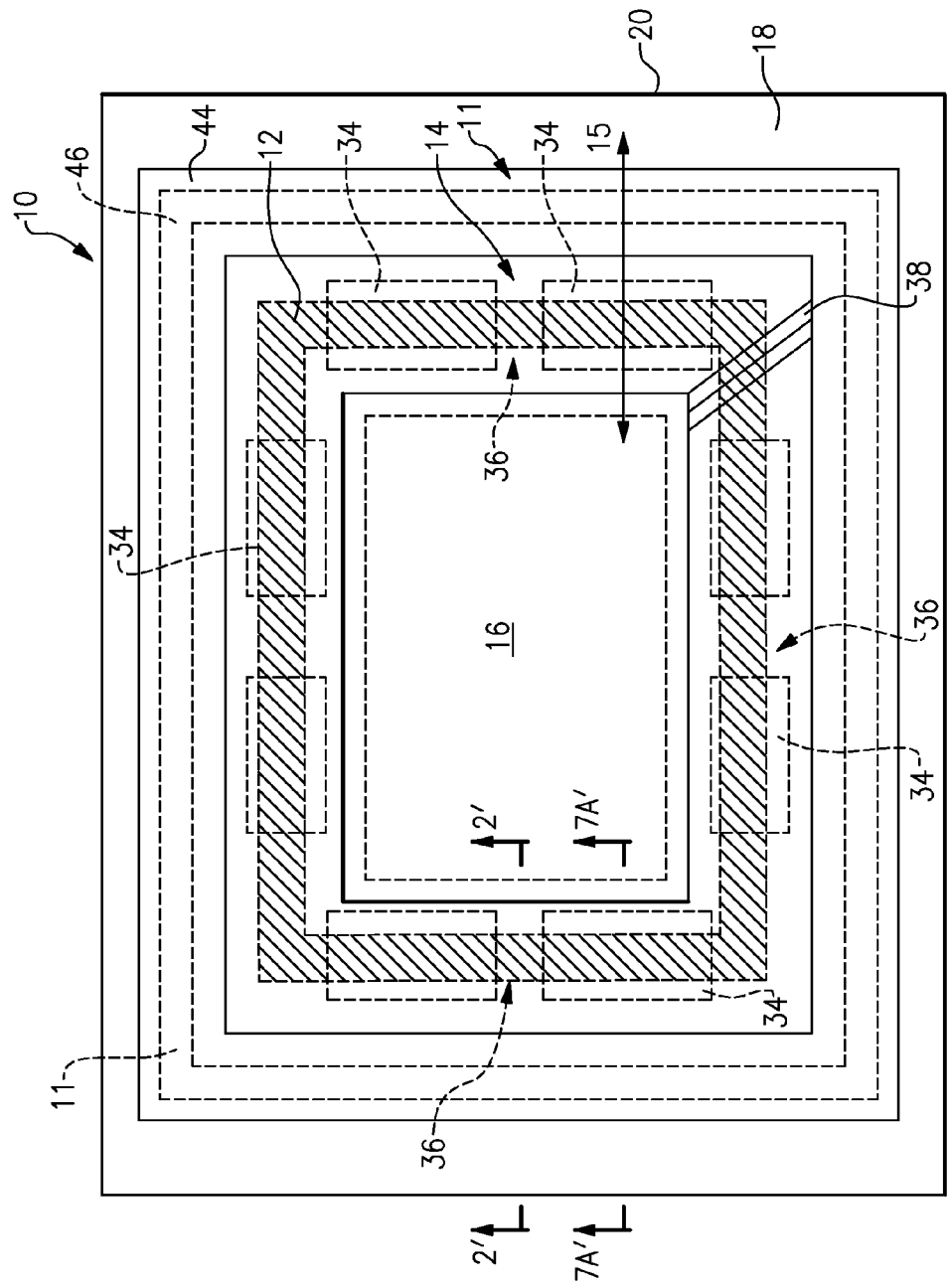
FIG. 1 is a plan view illustrating a microelectronic element, e.g., a semiconductor chip, in accordance with the prior art.
Figure 2:
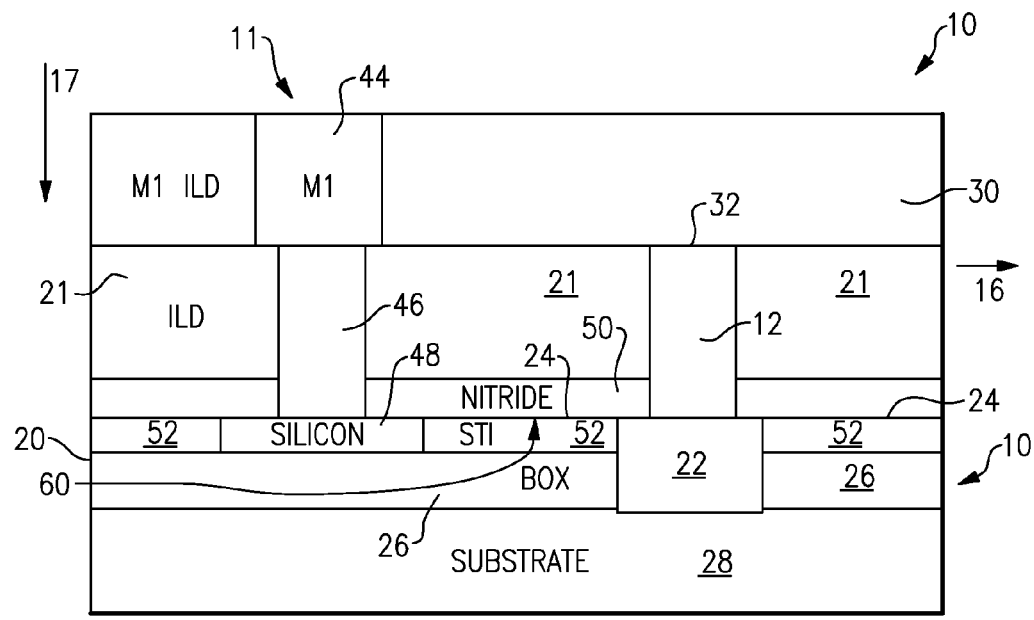
FIG. 2 is a corresponding sectional view through line 2-2' of FIG. 1.
Figure 3:
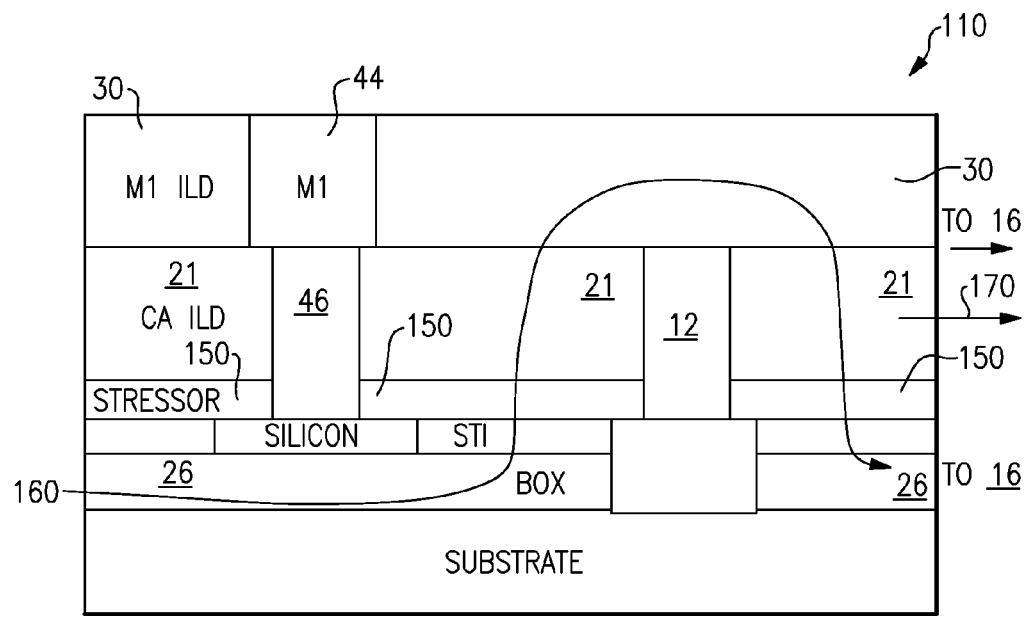
FIG. 3 is a sectional view of a microelectronic element illustrating a problem to be addressed by microelectronic elements in accordance with an embodiment of the invention.

FIG. 3 is a sectional view illustrating a chip 110 similar to the chip 10 depicted in FIGS. 1 and 2, which has features similar to those described above as background to the embodiments of the invention described herein. The structure shown in FIG. 3 is illustrative of a problem recognized by the inventors. The structure illustrated in FIG. 3 is the same as that shown in FIGS. 1 and 2 except for the substitution of a stressor layer 150 in FIG. 3 for the nitride barrier layer 50 shown in FIG. 2. For various reasons, such as for a purpose of simplifying a process of fabricating the semiconductor chip, it is possible that a stressor layer 150 would be provided in place of the nitride barrier layer 50, such as when a stressor layer 150 forms a part of a design of semiconductor devices in the active portion 16 of the chip. In one possible scheme, the stressor layer 150 could consist essentially of silicon nitride but differ from the silicon nitride layer 50 (FIG. 2) of the prior art chip in that it has a high internal stress, e.g., an internal stress having a magnitude of about 0.5 gigapascals (GPa) or higher.

A problem exists in that a stressed nitride layer 150 functions inadequately as a barrier to mobile ions. Hence, in FIG. 3, mobile ions are shown to travel along a path 160 successively through the BOX layer 26, then through the dielectric region 52, the stressor layer 150 and then into the lower ILD region 21 and then the M1 ILD region 30. Once beyond the ring 12 inside the M1 ILD region, the mobile ions could travel unimpeded in the direction 170 into areas of the chip where active devices are. The mobile ions then could affect the performance of the active devices. As also seen in FIG. 3, the mobile ions could travel downward along the path 160 through another portion of the contact ILD region 21, through the stressor layer 150 again and the dielectric region 52 to reach the BOX layer 26. From within the BOX layer, mobile ions could also travel into the active portion 16 of the chip affect the performance of active devices there.

Figure 4A:
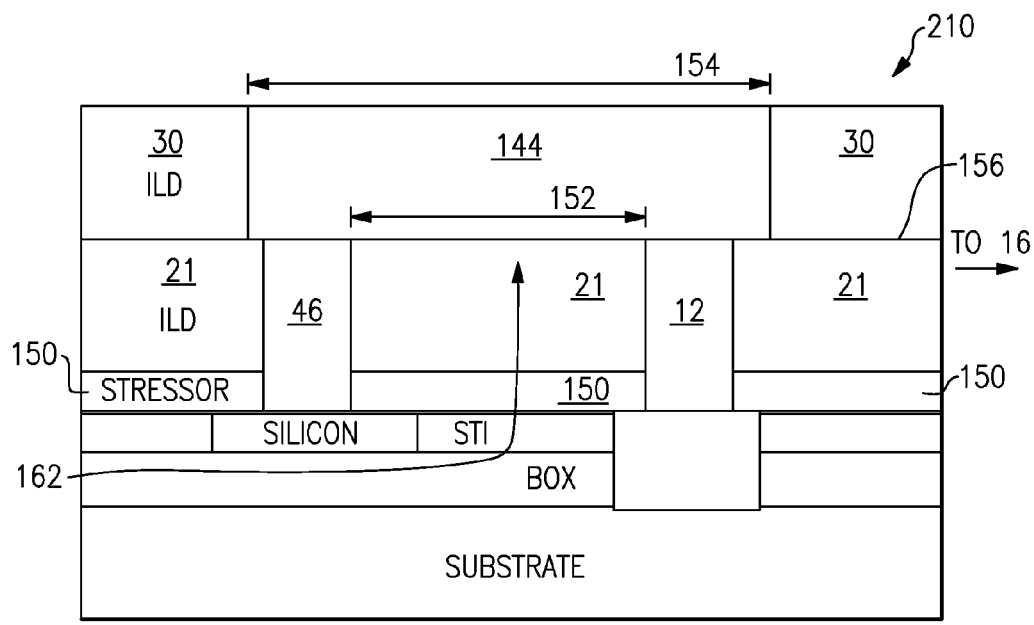
FIG. 4A is a sectional view through line 4A-4A of FIGS. 4B and 5, illustrating a stage of fabricating a microelectronic element, e.g., a semiconductor chip, in accordance with an embodiment of the invention.

Since the internally stressed layer 150 of silicon nitride is an inadequate barrier, the problem of mobile ions needs to be addressed differently. Accordingly, in an embodiment of the invention, the guard ring and crack stop are modified as illustrated in FIG. 4A. As seen therein, an M1 metal ring 144 of the M1 metallization level now extends in a lateral direction so as to contact upper surfaces of a first crack stop ring 46 of the crack stop and the ground ring ("GR") contact ring 12 of the guard ring. In this way, the metal ring 144 forms a seal that prevents mobile ions in path 162 from traveling beyond the guard ring towards the active portion 16 of the chip.

Typically, the first crack stop ring 46 and the GR contact ring 12 are separated in the lateral direction by a distance 152 of at least one to two microns. Thus, the metal ring 144 can be significantly wider than other M1 level metal lines of the chip 210, which can have widths of a few tens of microns to a few hundred microns. For example, in one embodiment, the continuous metal ring 144 can have a width 154 of one to two microns or more.

Figure 4B:
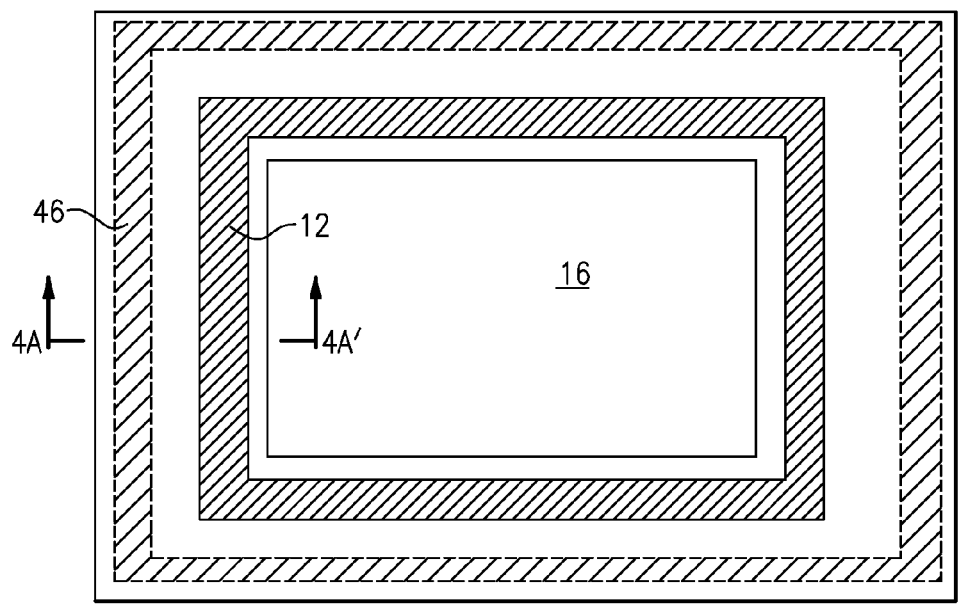
FIG. 4B is a plan view illustrating a stage of fabricating a microelectronic element in accordance with an embodiment of the invention.

The continuous metal ring 144 can be formed simultaneously with other M1 level metal wiring lines of the chip. In one embodiment, rectangular ring-shaped slots are etched in the lower ILD layer 21 of sufficient dimensions where the first crack stop ring 46 and the GR contact ring 12 are to be formed. Simultaneously, contact vias (not shown) can be etched in areas of the active portion 16 of the chip for contacting semiconductor regions of active devices of the chip. The ring-shaped slots and the contact vias then can be filled with conductive material to from the crack stop ring 46 and the GR contact ring 12. For example, a metal or conductive compound of a metal, e.g., a silicide, conductive nitride, or both a metal and a conductive compound of metal can be deposited in the slots and contact vias to form these structures. Conductive material that remains on exposed surfaces 156 above a major surface 156 of the lower ILD layer 30 can be removed, such as by an etchback process or a planarization process such as chemical-mechanical polishing ("CMP"). FIG. 4B is a plan view illustrating the chip 210 after the crack stop ring 46 and the GR contact ring are formed.

Figure 5:
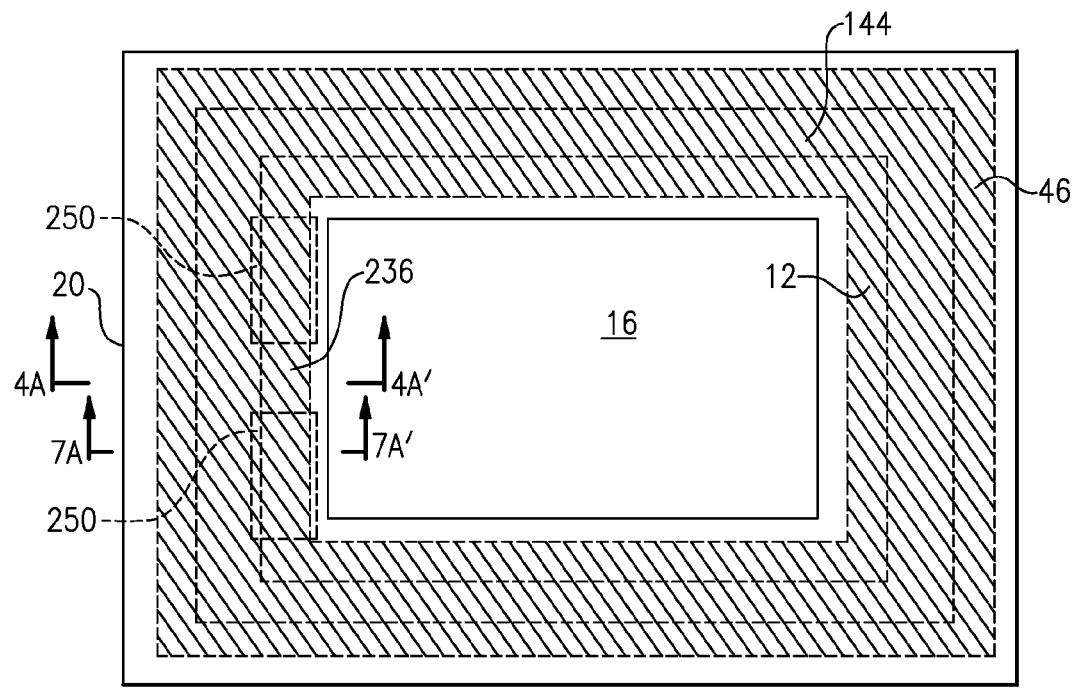
FIG. 5 is a plan view illustrating a stage of fabricating a microelectronic element subsequent to the stage illustrated in FIG. 4B.

Thereafter, a rectangular ring-shaped trough is formed in the M1 ILD layer 30 which overlays each of the rectangular ring-shaped slots. Simultaneously, other troughs (not shown) can be formed in the M1 ILD layer 30 in the active portion 16 of the chip for the purpose of forming metal wiring lines in such areas. A metal, conductive compound of a metal or a metal and a conductive metal compound then can be deposited in the troughs, followed by an etchback process or planarization process, e.g., CMP, to form the rectangular metal ring 144 and other metal wiring lines (not shown) of the chip. FIG. 5 is a plan view illustrating the chip 210 after the metal ring 144 is formed, connecting the underlying crack stop ring 46 and the GR contact ring.

In a variation of the above-described method, the metal ring 144, the crack stop ring 46 and the GR contact ring 12 can be formed in accordance with dual damascene processing methods. In such case, the rectangular trough may be formed such that it extends somewhat into the lower ILD layer 21. In addition, the slots and the holes for forming vias (not shown) are not filled until after the troughs for forming the metal ring 144 and other metal lines of the chip are etched into the M1 ILD layer 30. Then, the metal or other conductive material can be deposited simultaneously into the troughs, the slots and the via holes left open below the troughs to form the metal ring 144, the first crack stop ring 46, the GR contact ring 12, and other vias and metal wiring lines of the chip.

Figure 6:
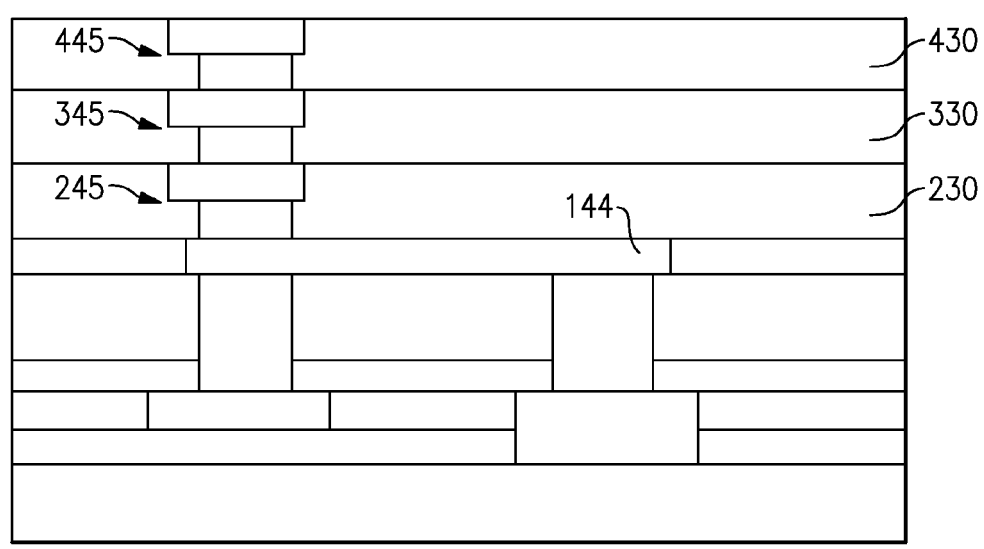
FIG. 6 is a sectional view through line 4A-4A' illustrating a microelectronic element in accordance with an embodiment of the invention.

FIG. 6 is a sectional view taken through the same line (4A-4A of FIGS. 4B and 5) as the sectional view of FIG. 4A, after overlying crack stop structure has been formed. The overlying crack stop structure includes a second continuous crack stop ring 245, a third continuous crack stop ring 345 and a fourth continuous crack stop ring 445, each of which is disposed in a corresponding ILD layer, i.e., an M2 ILD layer 230, an M3 ILD layer 330 and an M4 ILD layer 430. Since the section line 4A-4A passes through a gap 234 between pedestals 250 of the guard ring, no other guard ring structure is shown in FIG. 6 that overlies the metal ring 144.

Figure 7A:
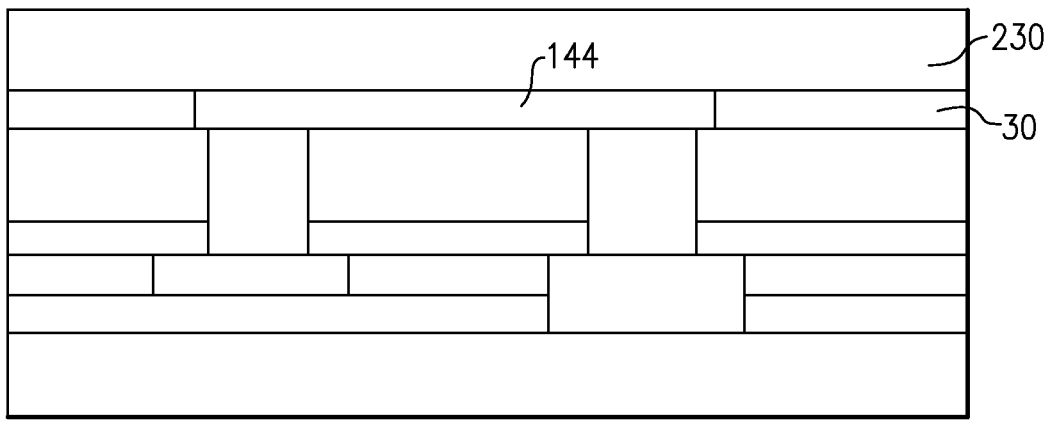
FIGS. 7A-7C are sectional views through line 7A-7A' of FIG. 5 which illustrate a series of stages in fabricating a microelectronic element subsequent to the stage illustrated in FIG. 5.
Figure 7B:
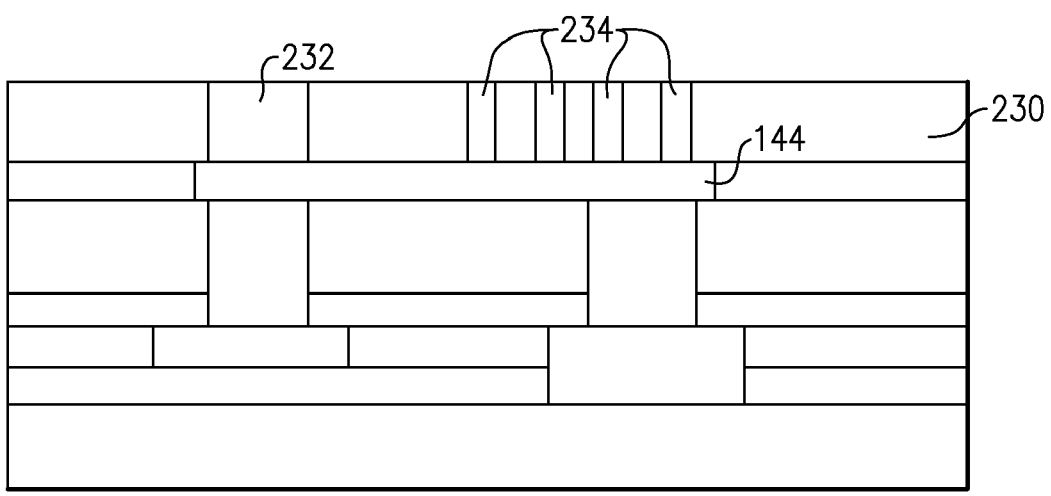

Beginning with FIG. 7A, the processes used to fabricate the second, third and fourth crack stop rings are described. In the series of FIGS. 7A-C and 9, the sectional view is taken through a line 7A-7A' which extends through conductive pedestals 250 of the guard ring which are similar to the conductive pedestals 34 shown in FIG. 1. For ease of illustration, only two conductive pedestals 250 have been shown with one gap 236 between them. However, the conductive pedestals and gaps between them will normally extend in alignment with the GR contact ring 12 all around the periphery of the active chip portion 16.

As shown in FIG. 7A, a second metallization level ILD 230 referred to as an "M2" ILD is formed overlying the metal ring 144, the M1 ILD layer 30 and other M1 metal wiring lines (not shown) disposed within the active portion of the chip (not shown). The M2 ILD 230 then is patterned simultaneously by etching to form an M2 level slot 232 and a plurality of via holes 234, such that a surface of the metal ring 144 is disposed within the etched slot and holes 234. Simultaneously, via holes (not shown) can be formed in the active portion (not shown) of the chip to support wiring in the active portion of the chip.

Figure 7C:
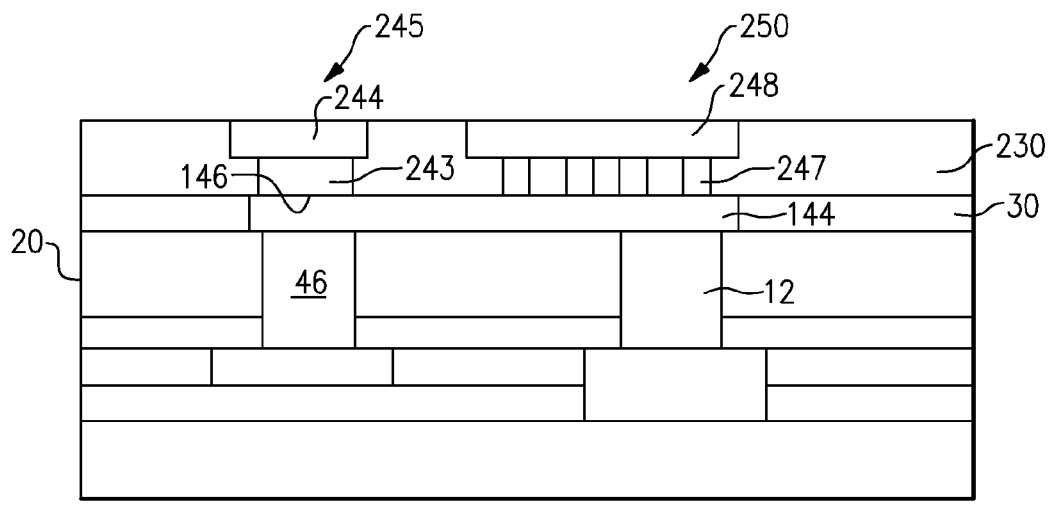

Subsequently, troughs are defined in the same M2 ILD layer 230 which then are simultaneously filled, along with the slot 232 and via holes 234, with conductive material to form a dual damascene M2 structure as illustrated in FIG. 7C. Typically, the conductive material includes a metal and may also include a conductive compound of a metal. As seen therein, an M2 metal line 244 and the metal-filled slot 243 now form a second crack stop ring 245 which has a lower surface 146 conductively contacting the underlying M1 metal ring 144. In addition, another M2 metal line 248 and a plurality of individual vias 247 formed by filling the metal holes form a conductive pedestal 250 of the guard ring.

Figure 8:
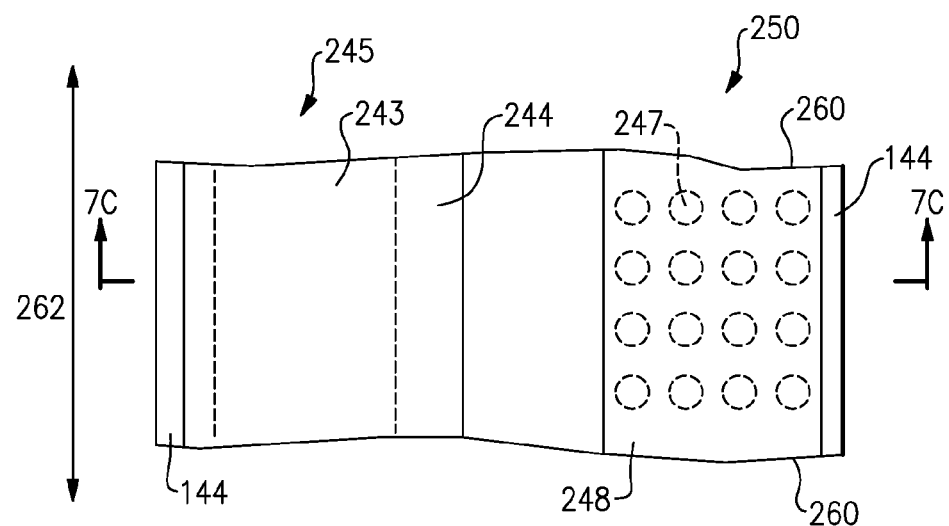
FIG. 8 is a fragmentary partial plan view illustrating a portion of a microelectronic element in accordance with an embodiment of the invention.

FIG. 8 is a fragmentary partial plan view illustrating the conductive features of the structure, wherein FIG. 7C represents the sectional view taken through line 7C-7C of FIG. 8. The curved lines 260 in FIG. 8 indicate that the second crack stop ring 245 (which includes the metal-filled slot 243 and the metal line 244), and the conductive pedestal 250 (which includes metal line 248 and individual conductive vias 247) extend farther beyond the curved lines in directions 262 parallel to the chip edges 20. The conductive pedestal 250 can have a structure as depicted in FIG. 1 in which conductive pedestals are interrupted by gaps 36 at intervals along the chip edges 18.

The second crack stop ring 245 is similar to the first crack stop ring 46 in that it encompasses the entire active portion of the chip to form an uninterrupted barrier to mobile ions. However, as seen in FIG. 8, unlike the second crack stop ring 245, the individual conductive vias 247 are discrete features separated by dielectric material of the M2 ILD layer 230. The vias do not form an uninterrupted barrier to mobile ions. Thus, as depicted in FIG. 7C, the uninterrupted solid metal ring 144 provided in the M1 ILD layer is the only uninterrupted barrier to mobile ions between the peripheral edge 20 of the chip and the active portion of the chip beyond the GR contact ring 12.

Figure 9:
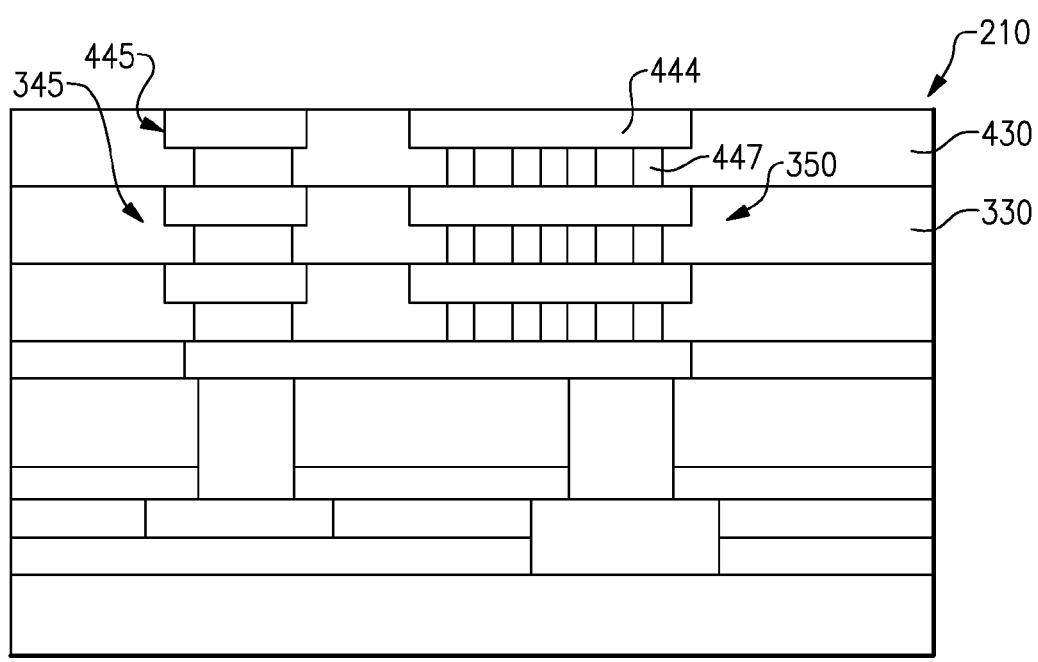
FIG. 9 is a sectional view through line 7A-7A' of FIG. 5 which illustrate a microelectronic element in accordance with an embodiment of the invention.

FIG. 9 illustrates the chip 210 after subsequent processing is performed by which an M3 level ILD 330 is formed and metal features including a third crack stop ring 345 and a further conductive pedestal 350 are formed therein. In one embodiment, these features can be formed by repeating steps to form the M3 ILD 330 and metal features therein in similar manner as used to form the M2 ILD and the conductive features therein as described above with respect to FIGS. 7A-C, and 8. Thereafter, in forming a fourth (M4) metal layer 430 of the chip near the external surface of the chip, a continuous metal line 444 can be formed which entirely surrounds the active portion of the chip without having gaps between lines as in the case of the pedestals 250. The fourth metal ring 444 can provide a conductively continuous feature which is not interrupted by gaps 236 (FIG. 5) at intervals along the lengths of the edges 20 of the chip for providing a path to ground to protect against electrostatic discharges in the fully formed chip. In one embodiment, the continuous metal ring 444 can be provided in a metallization level of the chip exposed at an exterior surface of the chip or is disposed just below a dielectric layer exposed at the exterior surface of the chip. Alternatively, the continuous metal ring 444 can be provided in a lower (e.g., M3) metallization level of the chip.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A microelectronic element, comprising:
   a semiconductor chip including a monocrystalline silicon-on-insulator layer ("SOI layer"), a bulk monocrystalline silicon layer and a buried oxide (BOX) layer separating the SOI layer from the bulk silicon layer, the SOI layer having a plurality of microelectronic semiconductor devices therein, the chip having a plurality of peripheral edges extending in a direction away from the SOI layer downwardly through the BOX layer and the bulk silicon layer;
   a crack stop extending in first lateral directions at least generally parallel to the edges of the chip to define a ring-like barrier separating an active portion of the chip inside the barrier with a peripheral portion of the chip outside the barrier, the crack stop including a first crack stop ring contacting a silicon portion of the chip above the BOX layer and extending continuously in the first lateral directions to surround the active portion of the chip;
   a guard ring ("GR") including a GR contact ring extending downwardly through the SOI layer and the BOX layer to conductively contact the bulk monocrystalline silicon region, the GR contact ring extending linearly at least generally parallel to the first crack stop ring to surround the active portion of the chip, the GR further including a continuous metal ring extending continuously in the first lateral directions to surround the active portion of the chip, the metal ring connecting the GR contact ring with the first crack stop ring such that the metal line and the GR contact ring form a continuous seal preventing mobile ions from moving between the peripheral and active portions of the chip.

2. A microelectronic element as claimed in claim 1, wherein the crack stop further includes a plurality of metal lines disposed at different heights above the SOI layer and a plurality of vias connecting the plurality of metal lines at the different heights, each via extending continuously in the first directions to surround the active portion of the chip.

3. A microelectronic element as claimed in claim 1, wherein the first crack stop ring and the guard ring GR contact ring extend through a first interlevel dielectric ("ILD") layer, and the metal ring includes a metal line of a first metallization ("M1") level of the chip, the metal ring having a lower surface overlying the first crack stop ring and the guard ring GR contact ring.

4. A microelectronic element as claimed in claim 1, wherein the silicon portion of the chip contacted by the first crack stop ring is insulated from the bulk silicon region of the substrate by the BOX layer.

5. A microelectronic element as claimed in claim 1, wherein the silicon portion of the chip contacted by the first crack stop ring is a monocrystalline silicon portion of the SOI layer.

6. A microelectronic element as claimed in claim 1, wherein the guard ring includes a plurality of second metallization (M2) level metal lines extending in the first directions to define a metal ring interrupted by gaps, the interrupted metal ring surrounding the active portion of the chip and a plurality of discrete vias extending between the continuous metal ring and the plurality of M2 level metal lines.

7. A microelectronic element as claimed in claim 6, wherein the continuous metal ring is a first continuous metal ring, the microelectronic element further comprising a second continuous metal ring separated in the vertical direction from the first continuous metal ring by a plurality of metal lines at a plurality of different vertically stacked metallization levels of the chip.

8. A microelectronic element as claimed in claim 7, wherein the second continuous metal ring is provided at a highest metallization level of the chip.

9. A microelectronic element as claimed in claim 1, wherein the semiconductor chip further includes a dielectric layer having an internal stress greater than about 0.5 gigapascals (GPa) between the SOI layer and the first ILD layer.

10. A microelectronic element as claimed in claim 9, wherein the internally stressed dielectric layer includes internally stressed silicon nitride.

11. A microelectronic element as claimed in claim 10, further comprising a dielectric isolation region laterally separating the guard ring GR contact ring from the silicon portion contacted by the first crack stop ring, wherein the BOX layer, the dielectric isolation region and the internally stressed dielectric layer present a path for movement of mobile ions from the peripheral portion of the chip and the continuous metal ring and the guard ring GR contact ring block the mobile ions from reaching the active portion of the chip.

12. A method of fabricating a microelectronic element, comprising:
providing a semiconductor wafer including a monocrystalline silicon-on-insulator layer ("SOI layer"), a bulk monocrystalline silicon layer and a buried oxide (BOX) layer separating the SOI layer from the bulk silicon layer, the SOI layer having a plurality of microelectronic semiconductor devices therein, the chip having a plurality of peripheral edges extending in a direction away from the SOI layer downwardly through the BOX layer and the bulk silicon layer;
simultaneously forming a crack stop and a guard ring, the crack stop extending in first lateral directions at least generally parallel to the edges of the chip to define a ring-like barrier laterally separating an active portion of the chip inside the barrier with a peripheral portion of the chip outside the barrier, the crack stop including a first crack stop ring contacting a silicon portion of the chip above the BOX layer and extending continuously in the first lateral directions to surround the active portion of the chip, the guard ring including a GR contact ring extending downwardly through the SOI layer and the BOX layer to conductively contact the bulk monocrystalline silicon region, the GR contact ring extending linearly at least generally parallel to the first crack stop ring to surround the active portion of the chip, the guard ring further including a continuous metal ring extending continuously in the first directions to surround the active portion of the chip, the metal ring connecting the GR contact ring with the first crack stop ring such that the metal line and the GR contact ring form a continuous seal preventing mobile ions from moving between the peripheral and active portions of the chip.

13. A method as claimed in claim 12, wherein the crack stop further includes a plurality of metal lines disposed at different heights above the SOI layer and a plurality of vias connecting the plurality of metal lines at the different heights, each via extending continuously in the first directions to surround the active portion of the chip.

14. A method as claimed in claim 12, wherein the first crack stop ring and the GR contact ring extend through a first interlevel dielectric ("ILD") layer, and the metal ring includes a metal line of a first metallization ("M1") level of the chip, the metal ring having a lower surface contacting the first crack stop ring and the GR contact ring.

15. A method as claimed in claim 12, wherein the silicon portion of the chip contacted by the first crack stop ring is insulated from the bulk silicon region of the substrate by the BOX layer.

16. A method as claimed in claim 12, wherein the silicon portion of the chip contacted by the first crack stop ring is a monocrystalline silicon portion of the SOI layer.

17. A method as claimed in claim 12, wherein the guard ring includes a plurality of second metallization (M2) level metal lines extending in the first directions to define a metal ring surrounding the active portion of the chip, the metal ring being interrupted by a plurality of gaps, and a plurality of discrete vias extending between the continuous metal ring and the plurality of M2 level metal lines.

18. A method as claimed in claim 17, wherein the continuous metal ring is a first continuous metal ring, the microelectronic element further comprising a second continuous metal ring separated in the vertical direction from the first continuous metal ring by a plurality of metal lines at a plurality of different vertically stacked metallization levels of the chip.

19. A method as claimed in claim 18, wherein the second continuous metal ring is provided at a highest metallization level of the chip.

20. A method as claimed in claim 12, wherein the semiconductor chip further includes a dielectric layer having an internal stress greater than about 0.5 gigapascals (GPa) between the SOI layer and the first ILD layer.

21. A method as claimed in claim 20, wherein the internally stressed dielectric layer includes internally stressed silicon nitride.

22. A method as claimed in claim 21, further comprising a dielectric isolation region laterally separating the GR contact ring from the silicon portion contacted by the first crack stop ring, wherein the BOX layer, the dielectric isolation region and the internally stressed dielectric layer present a path for movement of mobile ions from the peripheral portion of the chip and the continuous metal ring and the GR contact ring block the mobile ions from reaching the active portion of the chip.

* * * * *